United States Patent [19]
Livengood et al.

[11] Patent Number: 6,150,718
[45] Date of Patent: Nov. 21, 2000

[54] METHOD AND APPARATUS FOR PERFORMING A CIRCUIT EDIT THROUGH THE BACK SIDE OF AN INTEGRATED CIRCUIT DIE

[75] Inventors: Richard H. Livengood, Los Gatos; Valluri R. M. Rao, Saratoga, both of Calif.; Jeffrey K. Greason, Portland, Oreg.

[73] Assignee: Intel Corporation, Santa Clara, Calif.

[21] Appl. No.: 09/240,141

[22] Filed: Jan. 29, 1999

Related U.S. Application Data

[62] Division of application No. 08/940,624, Sep. 30, 1997, Pat. No. 5,904,486.

[51] Int. Cl.$^7$ .................................................. H01L 23/48
[52] U.S. Cl. ......................... 257/750; 257/625; 257/758
[58] Field of Search .................................... 257/758, 750, 257/624, 625; 438/4, 14, 58, 59

[56] References Cited

U.S. PATENT DOCUMENTS

| | | |
|---|---|---|
| 3,976,873 | 8/1976 | Bottka et al. . |
| 4,144,503 | 3/1979 | Itoh et al. . |
| 4,273,421 | 6/1981 | Gurtler . |
| 4,480,916 | 11/1984 | Bareket et al. . |
| 4,503,541 | 3/1985 | Weller et al. . |
| 4,545,111 | 10/1985 | Johnsin et al. . |
| 4,583,226 | 4/1986 | Liou . |
| 4,661,770 | 4/1987 | von Roos . |
| 4,758,092 | 7/1988 | Heinriche et al. . |
| 4,759,958 | 7/1988 | Namata et al. . |
| 4,868,068 | 9/1989 | Yamaguchi et al. . |
| 4,961,812 | 10/1990 | Baerg et al. . |
| 4,980,019 | 12/1990 | Baerg et al. . |
| 4,995,002 | 2/1991 | Yamada et al. . |
| 5,037,771 | 8/1991 | Lipp . |
| 5,043,297 | 8/1991 | Suzuki et al. . |
| 5,097,201 | 3/1992 | Henley . |
| 5,164,664 | 11/1992 | Solekner . |
| 5,196,362 | 3/1993 | Suzuki . |
| 5,208,178 | 5/1993 | Usami . |
| 5,224,022 | 6/1993 | Weigler et al. . |
| 5,233,310 | 8/1993 | Inoue . |
| 5,246,539 | 9/1993 | Canestrari . |
| 5,332,470 | 7/1994 | Crotti . |
| 5,429,994 | 7/1995 | Ishikawa . |
| 5,483,166 | 1/1996 | Carey et al. . |
| 5,701,666 | 12/1997 | DeHaven et al. . |
| 5,805,421 | 8/1998 | Livengood et al. . |
| 5,832,595 | 11/1998 | Maruyama et al. . |
| 5,840,627 | 11/1998 | Huggins . |
| 5,872,360 | 2/1999 | Paniccia et al. . |
| 5,904,486 | 5/1999 | Livengood et al. . |
| 5,948,217 | 9/1999 | Winer et al. . |
| 5,976,980 | 11/1999 | Livengood et al. . |
| 6,001,703 | 12/1999 | Winer et al. . |

FOREIGN PATENT DOCUMENTS

| | | | |
|---|---|---|---|
| 0 295 065 | 12/1988 | European Pat. Off. | ............ 156/627.1 |
| 56-46534 | 4/1981 | Japan | ................................. 156/626.1 |
| 59-44827 | 3/1984 | Japan | ................................. 156/626.1 |
| 1-119037 | 5/1989 | Japan | ................................. 156/627.1 |

OTHER PUBLICATIONS

Paul Winer, "IC Failure Analysis, E–Beam Tutorial," International Reliability and Physics Symposium, 1996.

(List continued on next page.)

*Primary Examiner*—Sheila V. Clark
*Attorney, Agent, or Firm*—Blakely, Sokoloff, Taylor & Zafman LLP

[57] ABSTRACT

A method and an apparatus for performing circuit edits through the back side of a flip-chip packaged integrated circuit die. In one embodiment, a circuit edit is achieved by exposing first and second circuit edit connection targets through a semiconductor substrate of the integrated circuit die from the back side. Next, an insulating layer is deposited over the first and second circuit edit connection targets and the exposed semiconductor substrate. Next, the circuit edit connection targets are re-exposed through the insulating layer and a conductor is deposited over the re-exposed circuit edit connection targets and the deposited insulating layer from the back side of the integrated circuit to couple together the circuit edit connection targets.

3 Claims, 17 Drawing Sheets

OTHER PUBLICATIONS

Scott Silverman, "Laser Microchemical Technology Enables Real–Time Editing of First–Run Silicon", Solid State Technology, 1996.

Ann N. Campbell, "Fault Localization with the Focused Ion Beam (FIB) System", in Microelectronic Failure Analysis, ASM International, 1996.

Kurt J. Weingarten, Mark J. W. Rodwell, David M. Bloom, "Picosecond Optical sampling of GaAs Integrated Circuits,"IEEE Journal of Quantum Electronics, vol. 24, No. 2, Feb. 1988, pp. 198–220.

H. K. Heinrich, D. M. Bloom, Hemenway, "Noninvasive sheet charge density probe for integrated silicon devices,"1986 American Institute of Physics, Apr. 21, 1986, pp. 1066–1068.

Marvin Chester, Paul H. Wendland, "Electroabsorbtion Spectrum in Silicon,"Physical Review Letters, vol. 13, No. 6, Aug. 10, 1964 pp. 193–195.

Bernard Couillaud, Vittorio Fossati–Bellani, "Modellocked Lasers and Ultrashort Pulses,"Lasers & Applications, Jan. 1985, pp. 79–83, Feb. 1985, pp. 91–94.

Dr. Hansjoachim Hinkelmann, "Scanning Laser Microscopy,"Seminconductor International, Feb. 1985 (6 pages).

T. Nagatsuma, M. Shinagawa, M. Yaita, K. Takeya, "Electro–Optic Probing Technology for Ultrahigh–Speed IC Diagnosis,"1994 IEEE, pp. 1476–1483.

J. M. Wiesenfeld "Electro–optic sampling of high–speed devices and integrated circuits,"IBM J. Res. Develop. vol. 34, No. 2/3 Mar./May 1990, 141–161.

Heinrich, Harley Kent, Ph.D., "A noninvasive optical probe for detecting electrical signals in silicon integrated circuits,"Order No. 8723017, 1987.

H. K. Heinrich N. Pakdaman J.L. Prince, G. Jordy, M. Belaidi, R. Franch, D.C. Edelstein, "Optical detection of multibit logic signals at internal nodes in a flip–chip mounted silicon static random–access memory integrated circuit,"1992, American Vacuum Society, pp. 3109–3111.

Jacques I. Pankove,"Optical Processes in Semiconductors,"Dover Publications, Inc., 1971.

"Optical Sampling of GHz Charge Density Modulation In Silicon Bipolar Junction Transistors,"Electronics etters, Jul. 16, 1987, vol. 23, No. 15, pp.783–784.

A. A. Gutkin, F.E. Faradzhev, "Influence of the Polarization of Light on the Electroabsorbtion in Silicon,"Soviet Physics–Semiconductors, vol. 6, No. 9, Mar. 1973, pp. 1524–1527.

A. A. Gutkin, D. N. Nasledov, F.E. Faradzhev, "Influence of the orientation of the electric field on the polarization dependence of the electroabsorption in silicon,"Sov. Phys. Semicond., vol. 8, No. 6, Dec. 1974, pp. 781–782.

I.A. Merkulov, "Polarization effects in the electroabsorption in silicon,"Sov. Phys. Semicond., vol. 7, No. 11, May 1974, pp. 1465–1469.

A. Frova, P. Handler, F.A. Germano, D.E. Aspnes, "Electro–Absorption Effects at the Band Edges of Silicon and Germanium,"Physical Review, vol. 145, No. 2, May 13, 1966, pp. 575–583.

Richard A. Soref, Brian R. Bennett, "Electrooptical Effects in Silicon,"IEEE Journal of Quantum Electronics, vol. QE–23, No. 1, Jan. 1987, pp. 123–129.

H. K. Heinrich, N. Pakdaman, J.L. Prince, D.S. Kent, L.M. Cropp, "Picosecond Backside Optical Detection of Internal Signals in Flip–Chip Mounted Silicon VLSI Circuits,"Microelectronic Engineering 16, 1992, pp. 313–324.

"Measurement of Real–Time Digital Signals in a Silicon Bipolar Junction Transistor Using a Noninvasive Optical Probe,"Electronics Letters, vol. 22, No. 12, Jun. 5, 1986, pp. 650–652.

"Basic Photovoltaic Principles and Methods,"Solar Energy Research Institute, pp. 14–17.

M. Paniccia, V.R.M. Rao, W.M. Yee, "Optical Probing of Flip Chip Packaged Microprocessors,"Submitted for publication in the proceedings of 42 International conference of Electron, Ion and Photon Beam Technology and Nanofabrication, May 26–29, 1998.

Vladmir liberman, Vincent Malba, Anthony F. Bernhardt, "Integration of Vapor Deposited Polymide into a Multichip Module Packaging Process,"IEEE Transactions on Components, Packaging and Manfacturing Technology–Part B. vol. 20, No. 1, Feb. 1997.

METHOD AND APPARATUS FOR PERFORMING A CIRCUIT EDIT THROUGH THE BACK SIDE OF AN INTEGRATED CIRCUIT DIE

RELATED APPLICATIONS

This application is related to co-pending application Ser. No. 08/724,223, filed Oct. 2, 1996, entitled "A Method of Accessing the Circuitry on a Semiconductor Substrate from the Bottom of the Semiconductor Substrate," and assigned to the Assignee of the present application, which is a continuation of application Ser. No. 08/344,149, filed Nov. 23, 1994, now abandoned.

This application is also related to co-pending application Ser. No. 08/771,273, filed Dec. 20, 1996, entitled "Method and Apparatus for Editing an Integrated Circuit," and assigned to the Assignee of the present application.

This application is also related to co-pending application Ser. No. 08/771,712, filed Dec. 20, 1996, entitled "Method and Apparatus for Endpointing While Milling an Integrated Circuit," and assigned to the Assignee of the present application.

This application is also related to co-pending application Ser. No. 08/941,888, filed Sep. 30, 1997, entitled "Method and Apparatus For Probing an Integrated Circuit Through the Back Side of an Integrated Circuit Die," and assigned to the Assignee of the present application.

This application is also related to co-pending application Ser. No. 08/940,830, filed Sep. 30, 1997, entitled "Method and Apparatus Providing a Circuit Edit Structure Through the Back Side of an Integrated Circuit Die," and assigned to the Assignee of the present application.

This application is also related to co-pending application Ser. No. 08/941,877, filed Sep. 30, 1997, entitled "Method and Apparatus Providing a Mechanical Probe Structure in an Integrated Circuit Die," and assigned to the Assignee of the present application.

FIELD OF THE INVENTION

The present invention relates generally to the field of integrated circuit testing and, more particularly, to a method and an apparatus for performing circuit edits in an integrated circuit for the purpose of verifying design engineering change orders.

BACKGROUND INFORMATION

Once a newly designed integrated circuit has been formed on a semiconductor substrate, the integrated circuit must be thoroughly tested to ensure that the circuit performs as designed. Portions of the integrated circuit that do not function properly are identified so that they can be fixed by correcting the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

During the debugging process, it is sometimes necessary to add, delete or reroute signal line connections within the integrated circuit. For instance, assume that FIG. 1A shows an integrated circuit 101 that requires edits to be made. In this example, circuit block A 103 is coupled to circuit block B 107 through inverter 105. If it is determined during the debug process that the signal from circuit block A 103 should not be inverted when received by circuit block B 107, integrated circuit 101 may be edited in a way such that inverter 105 is effectively removed from integrated circuit 101 and that circuit block A 103 is directly connected to circuit block B 107.

Using prior art techniques, integrated circuit 101 may be edited as follows. Inverter 105 may be disconnected from circuit block A 103 and circuit block B 107 by physically cutting the signal line through the front side of the integrated circuit die as shown in FIG. 1 with cut 111. After cut 109 111 is made, circuit block A 103 is no longer connected to circuit block B 107 through inverter 105. In order to reconnect circuit block A 103 and circuit block B 107, dielectric is removed from the front side of the integrated circuit die at locations 113 and 115 to expose the buried metal of the signal line connected to circuit block A 103 and circuit block B 107. After the dielectric is removed from the signal line at locations 113 and 115, a new metal line 117 is deposited over the dielectric on the front side of the integrated circuit die and over the exposed pieces of metal at locations 113 and 115 to directly connect circuit block A 103 to circuit block B 107.

FIG. 1B is an illustration of a cross-section of an integrated circuit package 121 including an integrated circuit die 125 on which circuit edits have been performed. As shown in FIG. 1B, integrated circuit package 121 includes wire bonds 123 disposed along the periphery of integrated circuit die 125 to electrically connect integrated circuit connections through metal interconnects 128 and 129 to pins 127 of the package substrate 131. Metal interconnects 128 and 129 are disposed in a dielectric isolation layer 141 of integrated circuit die 125, and are coupled to diffusion regions 135, 137 and 139.

It is noted that before the circuit edits shown in FIG. 1B were performed in integrated circuit die 125, diffusion 137 was coupled to diffusion 139 through metal interconnect 129. In addition, diffusion 135 was not coupled to diffusion 137. FIG. 1B shows circuit edits that have been performed to disconnect diffusion 137 from diffusion 139 and connect diffusion 135 to diffusion 137. As shown in FIG. 1B, diffusion 137 has been disconnected from diffusion 139 with metal interconnect 129 being physically cut by milling a hole 132 through the dielectric isolation layer 141 from the front side 145 of integrated circuit die 125. As shown in FIG. 1B, diffusion 137 has been disconnected from diffusion 139 as a result of hole 132. As shown in FIG. 1B, circuit edits have also been performed to connect diffusion 135 to diffusion 137. A hole 133 has been milled through dielectric isolation layer 141 from the front side 145 of integrated circuit die 125 to expose a portion of metal interconnect 128. Similarly, a hole 134 has been milled through dielectric isolation layer 141 from the front side 145 of integrated circuit die 125 to expose a portion of dielectric isolation layer 129. A conductor 130 has then been deposited over the dielectric isolation layer 141 and holes 133 and 134 to connect metal interconnect 128 to metal interconnect 129, thereby connecting diffusion 135 to diffusion 137.

As mentioned above, it is noted that integrated circuit package 121 of FIG. 1B is of a wire bond design. There are several disadvantages associated with the wire bond design of integrated circuit package 121. One problem stems from the fact that as the density and complexity of integrated circuit die 125 increases, so must the number of wire bonds 123 required to control the functions integrated circuit die 125. However, there are only a finite number of wire bonds 123 that can fit along the periphery of integrated circuit die 125. One way to fit more wire bonds 125 along the periphery of integrated circuit die 125 is to increase the overall size of integrated circuit die 125, thereby increasing its peripheral area. Unfortunately, an increase in the overall size of integrated circuit die 125 also significantly increases the integrated circuit manufacturing costs.

Another disadvantage with integrated circuit package 121 of FIG. 1B is that the active circuitry within integrated circuit die 125 must be routed through metal interconnects 128 and 129 to the peripheral region of integrated circuit die 125 in order to electrically couple the active circuitry to wire bonds 123. By routing metal interconnect lines 128 and 129 over a relatively long distance across the integrated circuit die 125, the increased resistive, capacitive and inductive effects of these lengthy interconnect lines results in an overall speed reduction of the integrated circuit device. In addition, the inductance of wire bonds 103 may also severely limit high frequency operation of integrated circuit devices in integrated circuit package 121.

With continuing efforts in the integrated circuit industry to increase integrated circuit speeds as well device densities, there is a trend towards using flip-chip technology when packaging complex high speed integrated circuits. Flip-chip technology is also known as control collapse chip connection (C4) packaging. In flip-chip packaging technology, the integrated circuit die is flipped upside-down. This is opposite to how integrated circuits are packaged today using wire bond technology, as illustrated in FIG. 1B. By flipping the integrated circuit die upside-down, ball bonds may be used to provide direct electrical connections from the bond pads directly to the pins of a flip-chip package.

To illustrate, FIG. 1C shows a flip-chip package 151 with an integrated circuit die 155 flipped upside-down relative to wire bonded integrated circuit die 125 of FIG. 1B. In comparison with wire bonds 123 of FIG. 1B, ball bonds 153 of flip-chip package 151 provide more direct connections between the circuitry in integrated circuit die 155 and the pins 157 of package substrate 161 through metal interconnects 169 and 171. As a result, the inductance problems that plague the typical wire bond integrated circuit packaging technologies are reduced. Unlike wire bond technology, which only allows bonding along the periphery of the integrated circuit die 155, flip-chip technology allows connections to be placed anywhere on the integrated circuit die surface. This results in reduced inductance power distribution to the integrated circuit which is another major advantage of flip-chip technology.

One consequence of integrated circuit die 155 being flipped upside-down in flip-chip package 151 is that access to the internal nodes of integrated circuit die 155 for circuit edit purposes has become a considerable challenge. As illustrated in FIG. 1B, prior art circuit editing techniques used with wire bond technology are based on performing the circuit edits on metal interconnects 128 and 129 through the front side 145 of the integrated circuit die 125. However, with flip-chip packaging technology, this front side methodology is not feasible since the integrated circuit die is flipped upside-down. For example, as illustrated in FIG. 1C, circuit edit access to metal interconnects 169 and 171 through the front side 173 of integrated circuit die 155 is obstructed by package substrate 161. In addition, diffusion regions 163, 165 and 167 obstruct circuit edit access to metal interconnects 169 and 171 from the back side 175 of the semiconductor substrate of integrated circuit die 155.

Thus, what is desired is a method and apparatus enabling circuit edits to be performed in a flip-chip packaged integrated circuit through the back side of an integrated circuit die.

SUMMARY OF THE INVENTION

A method and an apparatus for performing a circuit edit on an integrated circuit die is disclosed. In one embodiment, the method for performing a circuit edit in an integrated circuit die includes the steps of exposing from a back side of the integrated circuit die first and second circuit edit connection targets through a semiconductor substrate of the integrated circuit die, depositing an insulating layer over the semiconductor substrate of the integrated circuit die between the first and second circuit edit connection targets, and depositing a conductor over the insulating layer between the first and second circuit edit connection targets to couple together first and second circuit edit connection targets. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for performing a circuit edit in an integrated circuit die is disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention. While the diagrams representing embodiments of the present invention are illustrated in FIGS. 2A–5, these illustrations are not intended to limit the invention. The specific processes described herein are only meant to help clarify an understanding of the present invention and to illustrate various embodiments of how the present invention may be implements in order to achieve a desired result. For the purposes of this discussion, a semiconductor substrate may be a substrate including any material or materials used in the manufacture of a semiconductor device.

Figure 1A:
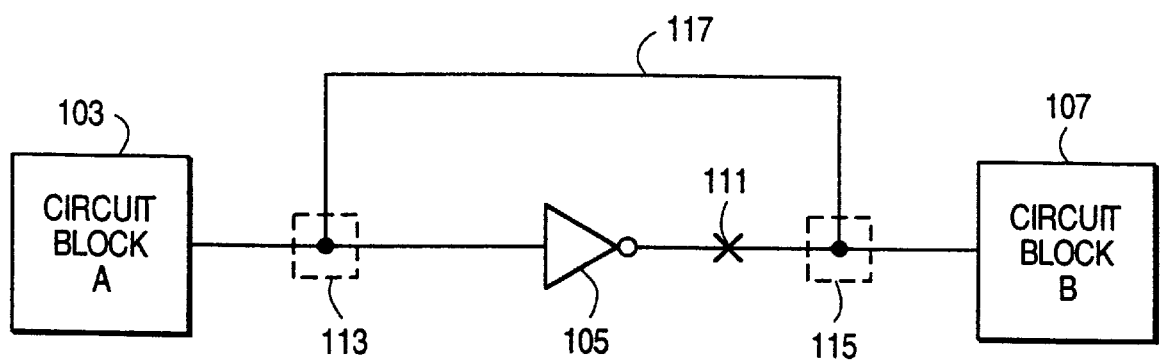
FIG. 1A is a schematic showing a circuit edit performed on an integrated circuit.
Figure 1B:
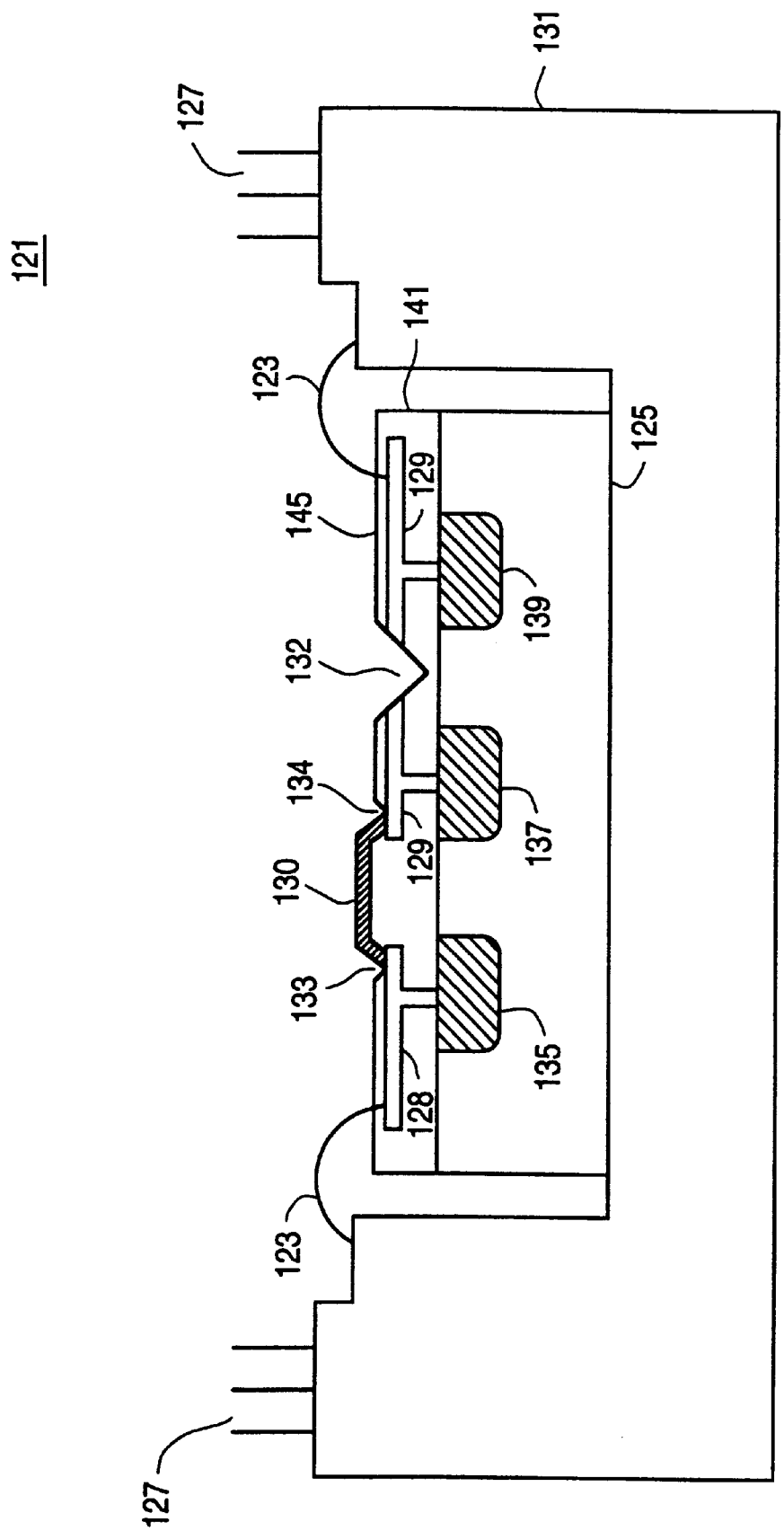
FIG. 1B is an illustration of a cross-section of a wire bond packaged integrated circuit die showing a circuit edit performed on an integrated circuit.
Figure 1C:
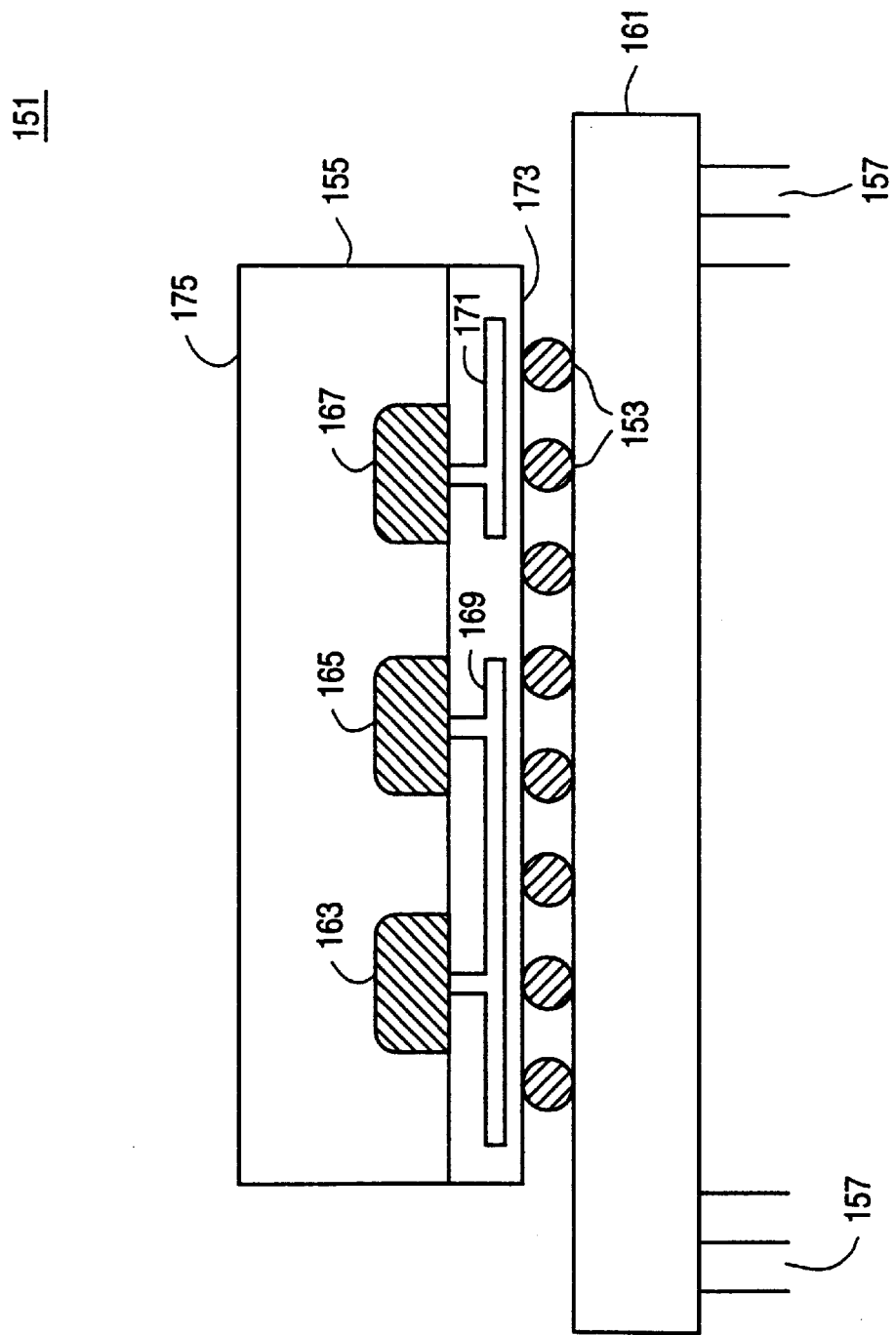
FIG. 1C is an illustration of a cross-section of a flip-chip or C4 packaged integrated circuit die.

The present invention is directed to a method and an apparatus that enables circuit edits to be performed on flip-chip packaged integrated circuit dies. As discussed earlier, prior art circuit edits are performed through the front side of integrated circuit die, but are not performed through the back side. With the continuing migration of packaging technology from wire bond technology to flip-chip technology, as illustrated in FIGS. 1B and 1C respectively, it is desired to develop the ability to perform circuit edits through the back side of the integrated circuit die.

Figure 2A:
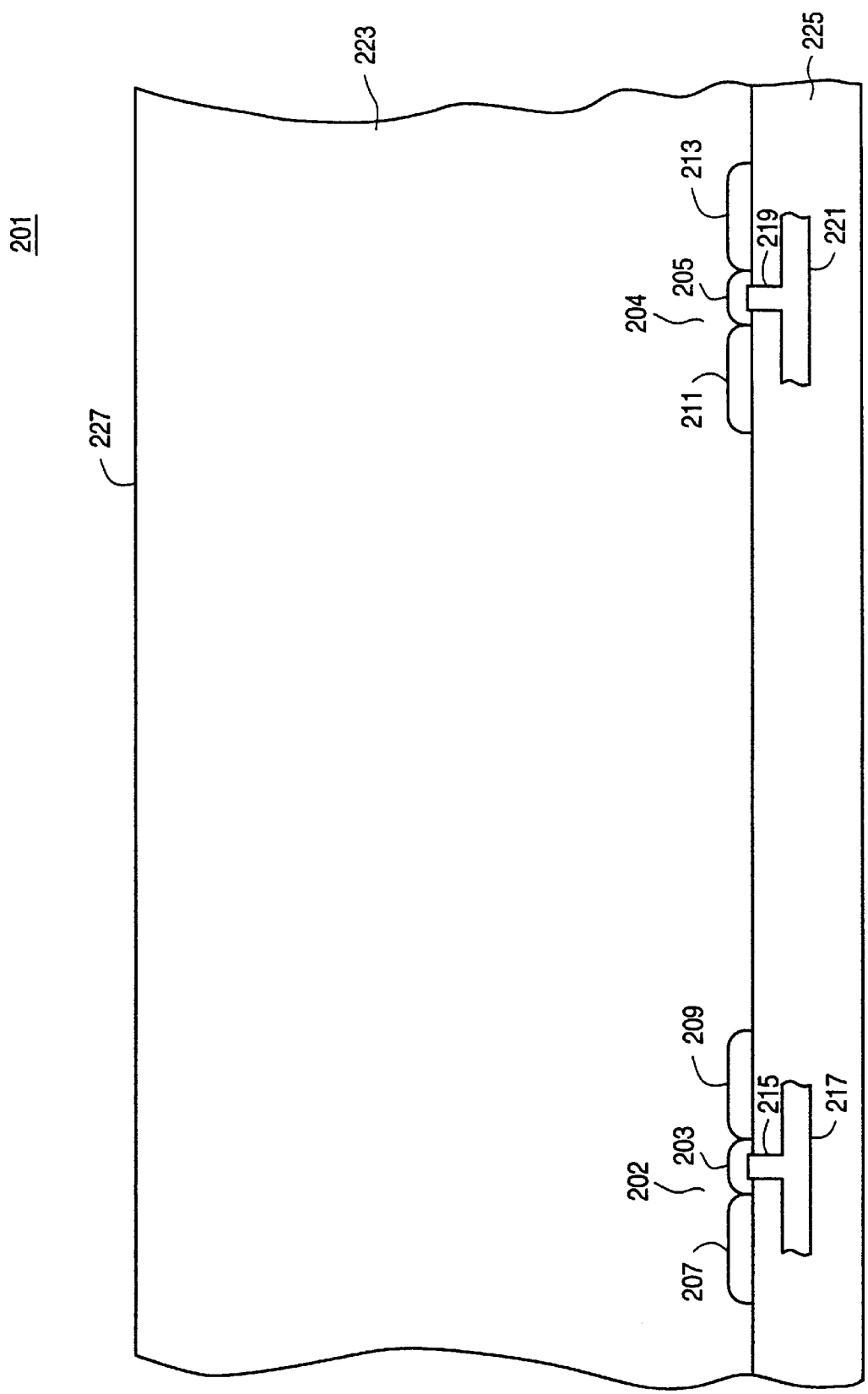
FIG. 2A is an illustration of a cross-section of a flip-chip packaged integrated circuit die including two unconnected circuit edit connection targets which are to be connected in accordance with the teachings of the present invention.

FIG. 2A is an illustration of a cross-section of a flip-chip packaged integrated circuit die 201, which includes two unconnected signal lines 217 and 221. As shown in the embodiment illustrated in 2A, signal lines 217 and 221 are disposed in a dielectric isolation layer 225 in integrated circuit die 201. In one embodiment, signal lines 217 and 221 are made of a conductive material, such as for example, metal, polysilicon, or the like. Signal line 217 is coupled to passive diffusion 203 through contact 215. Signal line 221 is coupled to passive diffusion 205 through contact 219. In one embodiment, connection target 202 includes passive diffusion 203 and contact 215, and connection target 204 includes passive diffusion 205 and contact 217. For the purposes of this disclosure, passive diffusion may be intepreted as a diffusion disposed in the semiconductor substrate for providing a signal access location. Passive diffusions 203 and 205 are disposed in the semiconductor substrate 223 of integrated circuit die 201. In one embodiment, semiconductor substrate 223 includes silicon. As shown in the embodiment illustrated in FIG. 2A, passive diffusion 203 is disposed in between field oxide or trench isolation oxide regions 207 and 209. Passive diffusion 205 is disposed between field oxide regions 211 and 213.

Figure 2B:
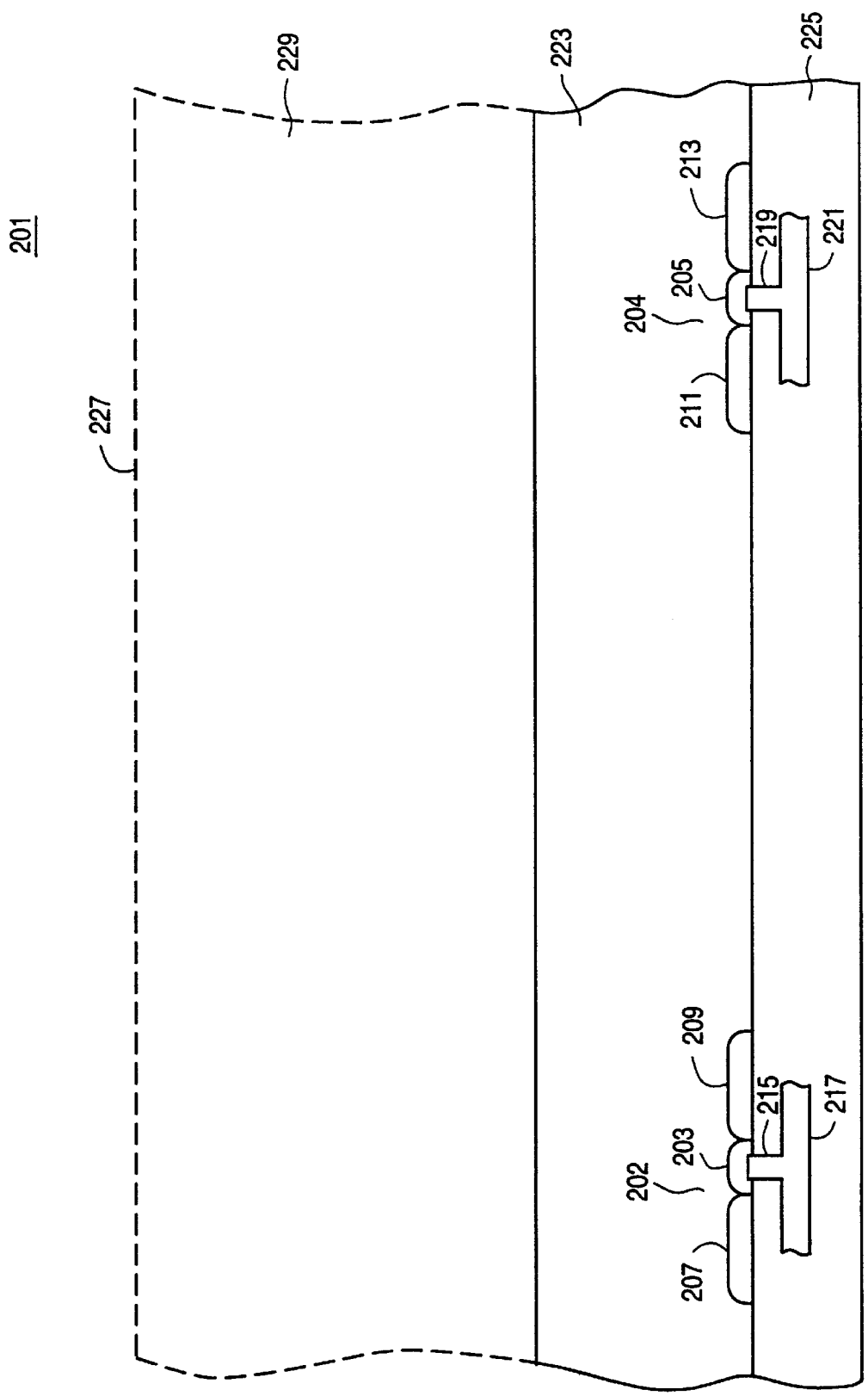
FIG. 2B is an illustration of a cross-section of a flip-chip packaged integrated circuit die that has been thinned from the back side in accordance with the teachings of the present invention.
Figure 2C:
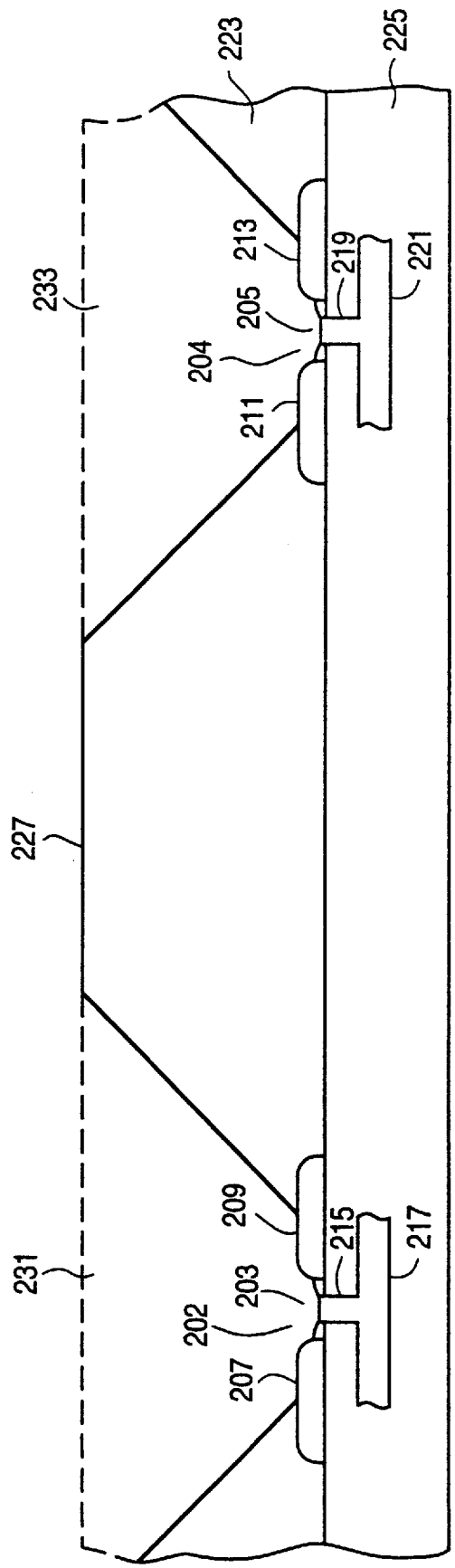
FIG. 2C is an illustration of a cross-section of an integrated circuit die with two circuit edit connection targets that have been exposed from the back side in accordance with the teachings of the present invention.

Assuming a circuit designer desires to perform a circuit edit on integrated circuit die 201 by coupling together signal lines 217 and 221, the following steps may be performed in accordance with the teachings of the present invention. In one embodiment, connection targets 202 and 204 are accessed through the back side 227 of flip-chip packaged integrated circuit die 201 to access signal lines 217 and 221 respectively. In another embodiment, signal lines 217 and 221 are accessed directly as circuit edit connection targets through the back side 227 of integrated circuit die 201. In general it is appreciated that any conductor in the integrated circuit die carrying a signal may be considered a connection target in accordance with the teachings of the present invention. Possible connection targets include, but are not limited to, metal lines, metal interconnects, polysilicon, diffusion and well taps. FIG. 2F, which will be discussed in greater detail below, illustrates an embodiment in which connection targets are included in signal lines disposed in the dielectric isolation layer of the integrated circuit. It is noted that useful circuit edit structures and techniques are described in co-pending application Ser. No. 08/940,830, filed Jun. 30, 1997, entitled "Method and Apparatus Providing A Circuit Edit Through the Back Side of Integrated Circuit Die," and assigned to the Assignee of the present application.

In one embodiment, flip-chip packaged integrated circuit die 201 is first thinned in the regions above connection targets 202 and 204 when a circuit edit is to be performed in accordance with teachings of the present invention. This aspect of the present invention is illustrated in FIG. 2B with back side portion 229 of semiconductor substrate 223 being removed above connection targets 202 and 204 from back side 227. In one embodiment, integrated circuit die 201 is globally thinned to a thickness of approximately 200 microns using well known techniques such as for example but not limited to mechanical polishing, mechanical machining, chemical etching, or the like. In another embodiment, integrated circuit die 201 may be locally trenched in the regions proximate to connection targets 202 and 204 to remove back side portion 229 using well known techniques. In yet another embodiment, integrated circuit die 201 is thinned using a combination of well known global and local thinning techniques.

It is noted that other useful techniques for thinning the flip-chip packaged integrated circuit die for access to structures in the integrated circuit through the back side are described in co-pending application Ser. No. 08/724,223, filed Oct. 2, 1996, entitled "A Method of Accessing the Circuitry on a Semiconductor Substrate From the Bottom of the Semiconductor Substrate," and assigned to the Assignee of the present application, which is a continuation application of Ser. No. 08/344,149, filed Nov. 23, 1994, now abandoned.

After the thinning step shown in FIG. 2B, a back side portion 231 of semiconductor substrate 223 above connection target 202 is milled away to expose passive diffusion 203 from the back side 227 of integrated circuit die 201. In addition, a back side portion 233 of semiconductor substrate 223 above connection target 204 is milled away to expose passive diffusion 205 from the back side 227 of integrated circuit die 201. In one embodiment, a portions of passive diffusions 203 and 205 are milled away and contacts 215 and 217 are directly exposed from back side 227. This aspect of the present invention is illustrated in FIG. 2C, which is a cross-section of integrated circuit die 201. In one embodiment, connection targets 202 and 204 are exposed using well known milling techniques, such as for example a focused ion beam milling tool. It is noted that useful techniques for end pointing while milling an integrated circuit are described in co-pending application Ser. No. 08/771,712, filed Dec. 20, 1996, entitled "Method and Apparatus for Providing Endpointing While Milling and Integrated Circuit," and assigned to the Assignee of the present application.

In another embodiment, back side portions 231 and 233 of semiconductor substrate 223 are milled away from the back side 227 such that signal lines 217 and 221 are directly exposed as circuit edit connection targets through dielectric isolation layer 225 and semiconductor substrate 223. In this embodiment, passive diffusions 203 and 205 are not needed in order to provide circuit edit connection targets.

Referring back to the embodiment illustrated in FIG. 2C, once connection targets 202 and 204 have been exposed, an insulating layer 235 is deposited over the exposed circuit edit connection targets 202 and 204, and the adjacent exposed semiconductor substrate 223. Insulating layer 235 serves to provide electrical isolation between circuit edit connection targets 202 and 204, and the exposed areas of bulk semiconductor substrate 223. In addition, insulating layer 235 also serves to provide an insulating platform that will be used to electrically isolate circuit edit connections, which will eventually be deposited over insulating layer 235.

In one embodiment, insulating layer 235 is locally formed with a focused ion beam induced chemical vapor deposition (CVD) system. In another embodiment, insulating layer 235 may be formed using other local techniques such as for example but not limited to laser induced CVD, electron beam induced CVD, and laser induced silicon oxide growth. In yet another embodiment, indulating layer 235 is globally formed over the back side 227 of integrated circuit die 201 using well known techniques including but not limited to plasma enhanced chemical vapor deposition (PECVD), a dielectric film evaporator, sputtering deposition, thermal growth or the like. It is noted that other helpful techniques for depositing an insulating layer are described in co-pending application Ser. No. 08/941,887, filed Sep. 30, 1997, entitled "Method and Apparatus Providing a Mechanical Probe Structure in an Integrated Circuit Die," and assigned to the Assignee of the present application.

Figure 2D:
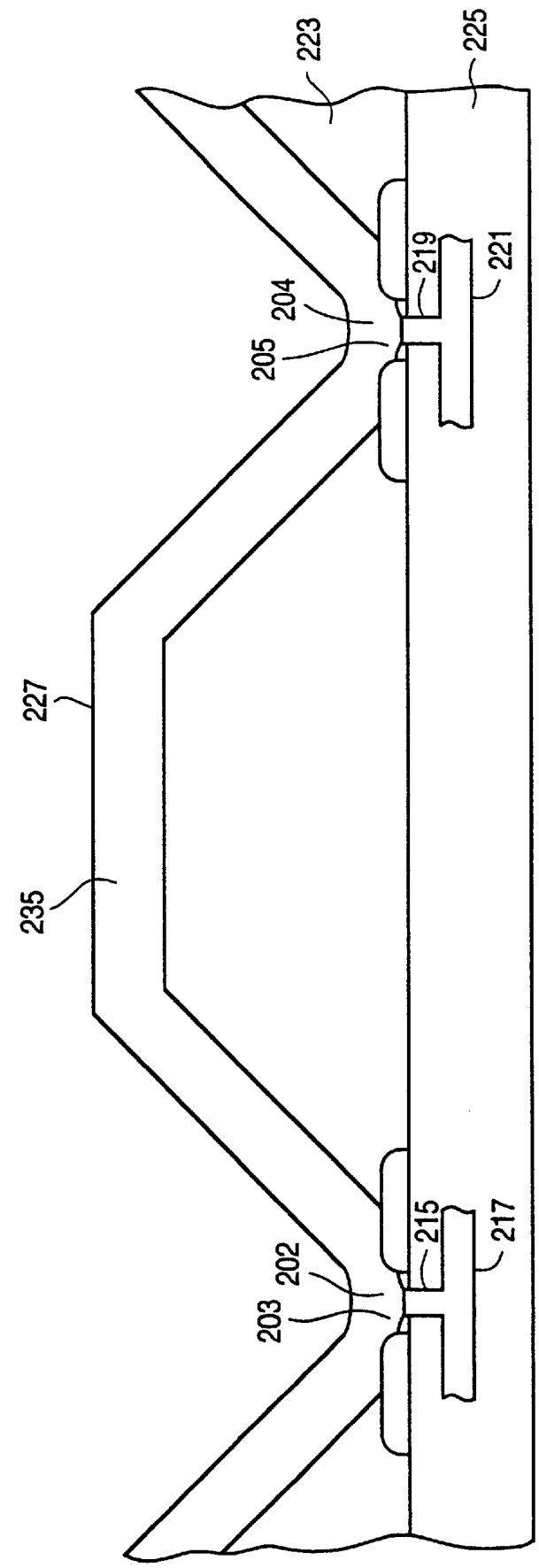
FIG. 2D is an illustration of a flip-chip packaged integrated circuit die that has been thinned and includes exposed circuit edit connection targets over which an insulating layer has been deposited in accordance with the teachings of the present invention.

After insulating layer 235 has been deposited as shown in FIG. 2D, circuit edit connection targets are re-exposed from the back side 227 of integrated circuit die 201. As shown in the embodiment illustrated in FIG. 2E, an opening 237 is milled through insulating layer 235 to re-expose connection target 202. An opening 239 is milled through insulating layer 235 to re-expose connection target 204. In one embodiment, openings 237 and 239 are milled using a focused ion beam (FIB) with chemical assisted etching. In another embodiment, openings 237 and 239 may be formed using other techniques such as straight FIB sputtering, laser chemical etching, laser ablation, electron beam chemical etching, or other similar techniques. In yet another embodiment, openings 237 and 239 may be formed using various well known lithography and etching techniques commonly used in integrated circuit fabrication.

Figure 2E:
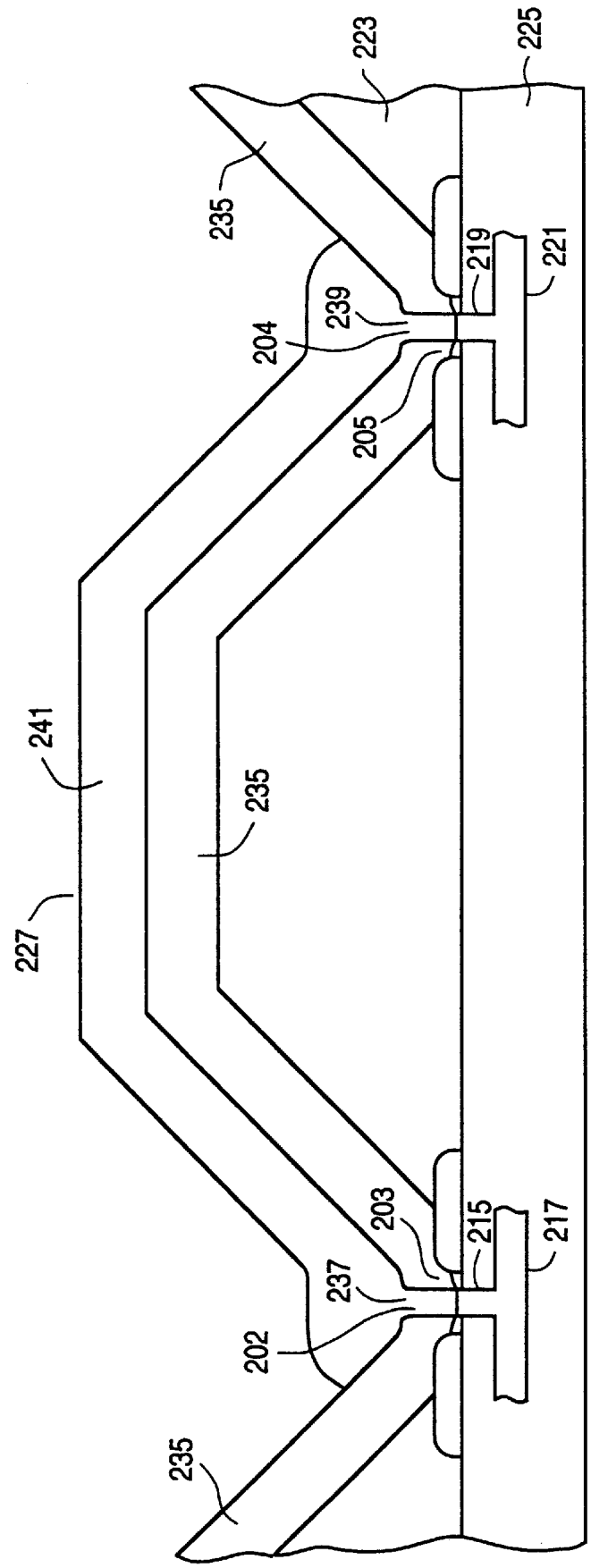
FIG. 2E is an illustration of a cross-section of a flip-chip packaged integrated circuit die with a conductor deposited between two circuit edit connection targets over the back side of the integrated circuit die in accordance with the teachings of the present invention.
Figure 2F:
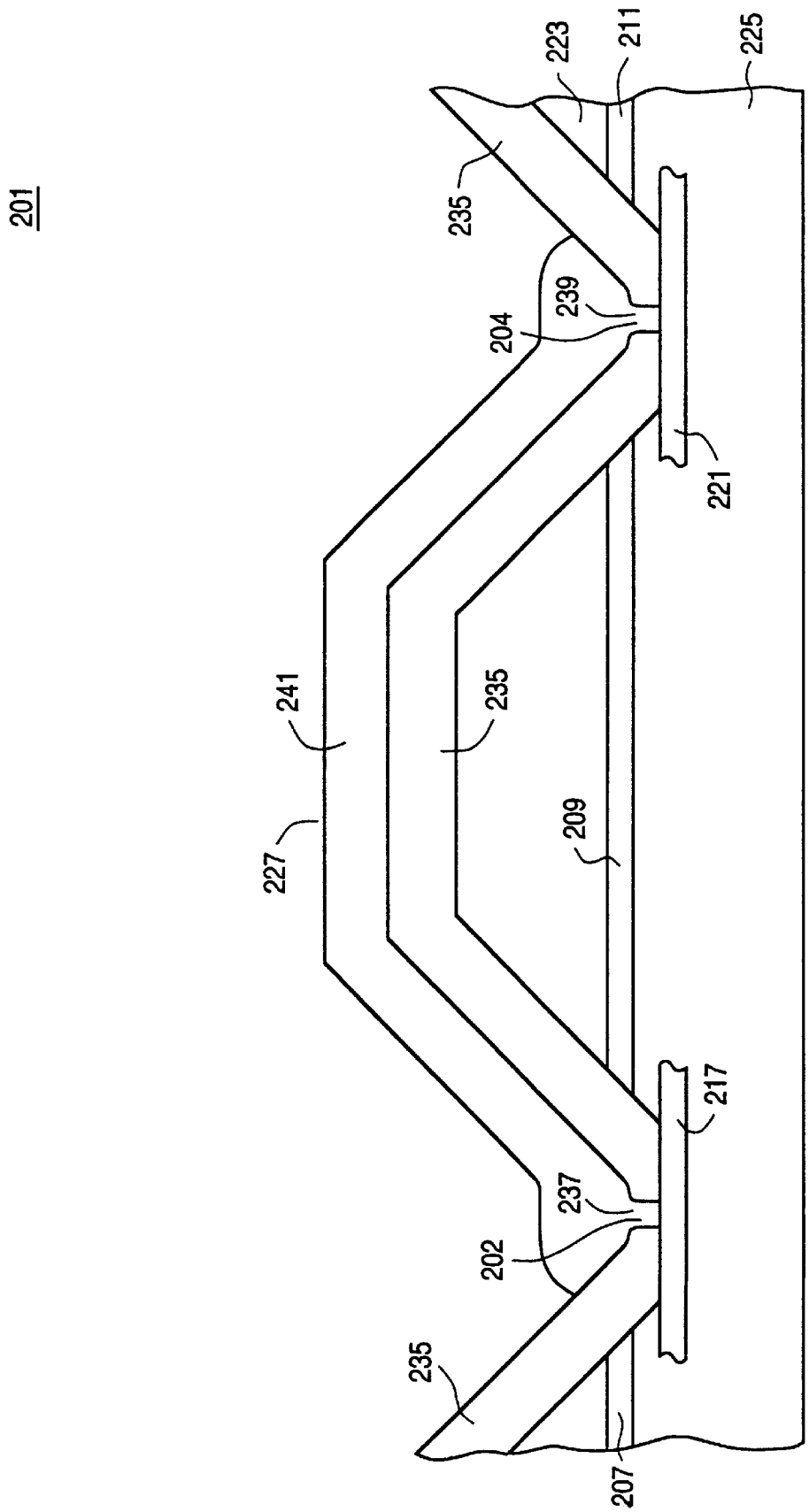
FIG. 2F is an illustration of alternate embodiment of a cross-section of a flip-chip packaged integrated circuit die with a conductor deposited in direct contact with circuit edit connection targets included in signal lines disposed in the dielectric isolation layer in accordance with the teachings of the present invention.

After connection targets 202 and 204 have been re-exposed, as illustrated in the embodiment shown in FIG. 2E, an additional local dielectric deposition may be useful to further isolate connection targets 202 and 204 from adjacent bulk semiconductor substrate. In this embodiment, the second local dielectric deposition may be done with a FIB induced dielectric chemical vapor deposition (CVD) system. However, this second local dielectric deposition step may be accomplished using other direct write local dielectric CVD techniques such as for example a laser CVD, an electron beam induced CVD or the like.

After the connection targets 202 and 204 have been exposed, and are isolated from the exposed bulk semiconductor substrate 223, a conductor 241 is deposited over the insulating layer 235 and through openings 237 and 239 to couple connection targets 202 and 204 together. As illustrated in the embodiment shown in FIG. 2E, connection target 202 is now coupled to connection target 204 through opening 237, conductor 241, and opening 239 to couple together signal line 217 and signal line 221. In one embodiment, conductor 241 is deposited using a FIB metal CVD, a laser metal CVD deposition tool, an electron beam deposition tool or the like. In one embodiment, conductor 241 includes a metal that is CVD deposited based on tungsten, platinum, or other metallo-organics such as gold, copper, silver based compounds or the like. In another embodiment, conductor 241 is deposited using well known global deposition techniques such as for example but not limited to a global deposition sputtering tool or global deposition evaporator, followed by well known lithography patterning techniques. Thus, conductor 241 provides a circuit edit connection between signal line 217 and 221 from the back side 227 of integrated circuit die 201. It is noted that other helpful techniques for depositing conductive material are also described in co-pending application Ser. No. 08/771,273, filed Dec. 20, 1996, entitled "Method and Apparatus for Editing an Integrated Circuit," and assigned to the Assignee of the present application.

Referring briefly back to FIG. 2B, it is noted that in another embodiment, exposed connection targets 202 and 204 may be relatively close together, such as for example less than approximately 50 microns apart. In this embodiment, insulating layer 235 may be deposited using a direct write deposition, such as for example, a FIB dielectric deposition, instead of a global dielectric deposition over the entire back side 227 of integrated circuit die 201. In this embodiment, the use of only a FIB dielectric deposition is feasible since connection targets 202 and 204 are relatively close together, and therefore a smaller overall amount of insulating layer 235 is deposited to electrically isolate connection targets 202 and 204 from the bulk semiconductor substrate 223. Furthermore, a smaller overall amount of insulating layer 235 is deposited to electrically isolate conductor 241 from the bulk semiconductor substrate 223, as illustrated in FIG. 2E.

FIG. 2F is an illustration of alternate embodiment of a cross-section of a flip-chip packaged integrated circuit die 201 in which a circuit edit connection is formed with alternate connection targets in accordance with the teachings of the present invention. As shown in FIG. 2F, integrated circuit die 201 includes a signal lines 217 and 221 disposed in dielectric isolation layer 225 beneath field oxide regions 207, 209 and 211. In the embodiment illustrated, signal lines 217 and 221 are accessed directly from the back side 227 of integrated circuit die 201 through semiconductor substrate 223, field oxide regions 207, 209 and 211 and dielectric isolation layer 225. Using techniques similar to those discussed above in connection with FIGS. 2A–2E, integrated circuit die 201 is thinned and then signal lines 217 and 221 is directly exposed from the back side 227 at connection targets 202 and 204. An insulating layer 235 is formed over exposed signal lines 217 and 221 and semiconductor substrate 223 and then openings 237 and 239 are formed in insulating layer 235 to re-expose signal lines 217 and 221. Conductor 241 is then deposited over and between openings 237 and 239 over insulating layer 235 to couple together signal lines 217 and 221 at connection targets 202 and 204.

In another embodiment, a flip-chip packaged integrated circuit die 301 includes two unconnected signal lines 317 and 321 disposed in a dielectric isolation layer 325 of integrated circuit die 301. In the embodiment illustrated in FIG. 3A, signal line 317 is coupled to passive diffusion 303 through contact 315. Signal line 321 is coupled to passive diffusion 305 through contact 319. In one embodiment, connection target 302 includes passive diffusion 303 and and contact 315, and connection target 304 includes passive diffusion 305 and contact 317. Passive diffusion 303 is disposed in semiconductor substrate 323 between field oxide regions 307 and 310. Passive diffusion 305 is disposed in semiconductor substrate 323 between field oxide regions 310 and 313.

Figure 3A:
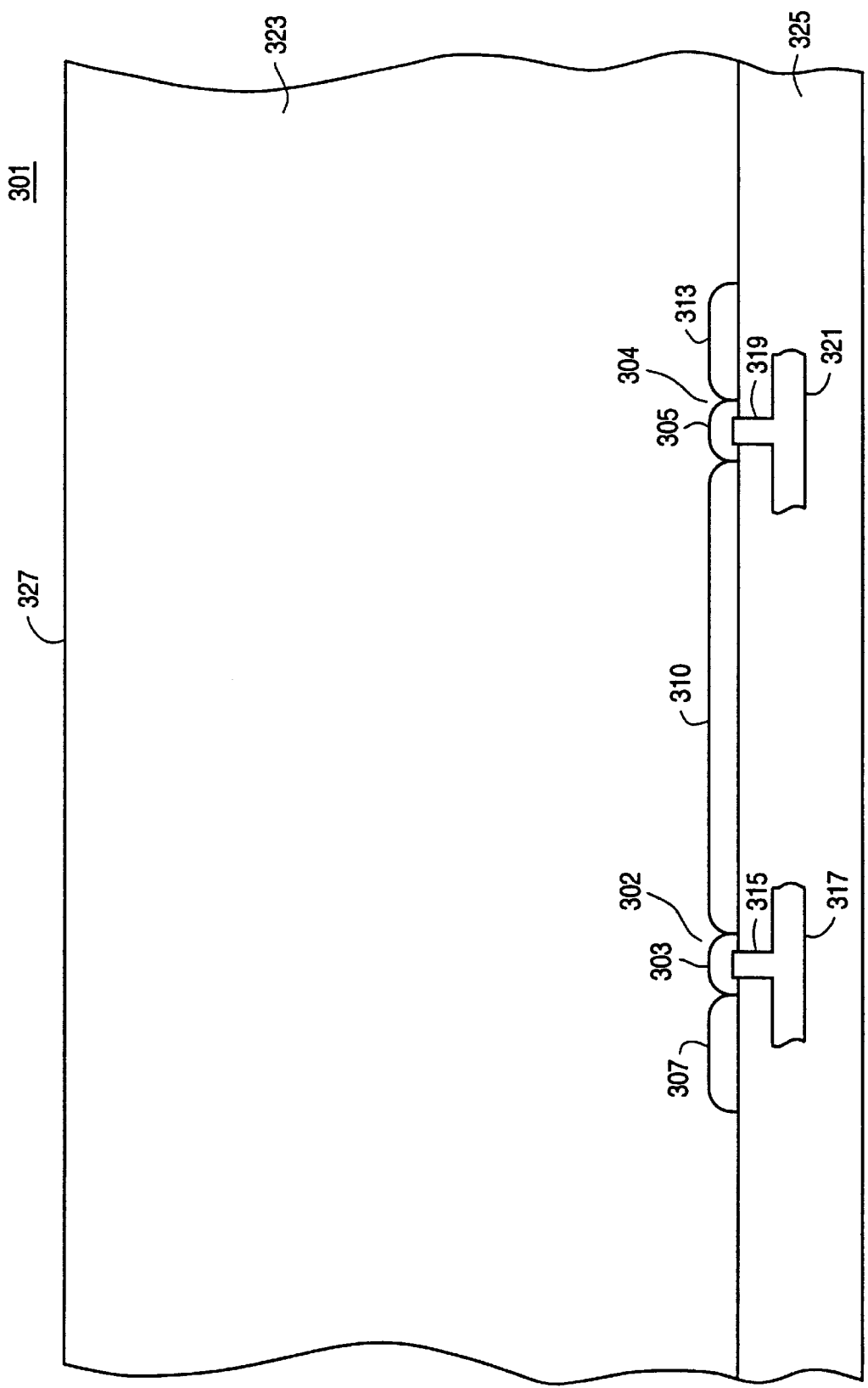
FIG. 3A is an illustration of a cross-section of a flip-chip packaged integrated circuit die with two unconnected circuit edit connection targets separated by a field oxide region.
Figure 3B:
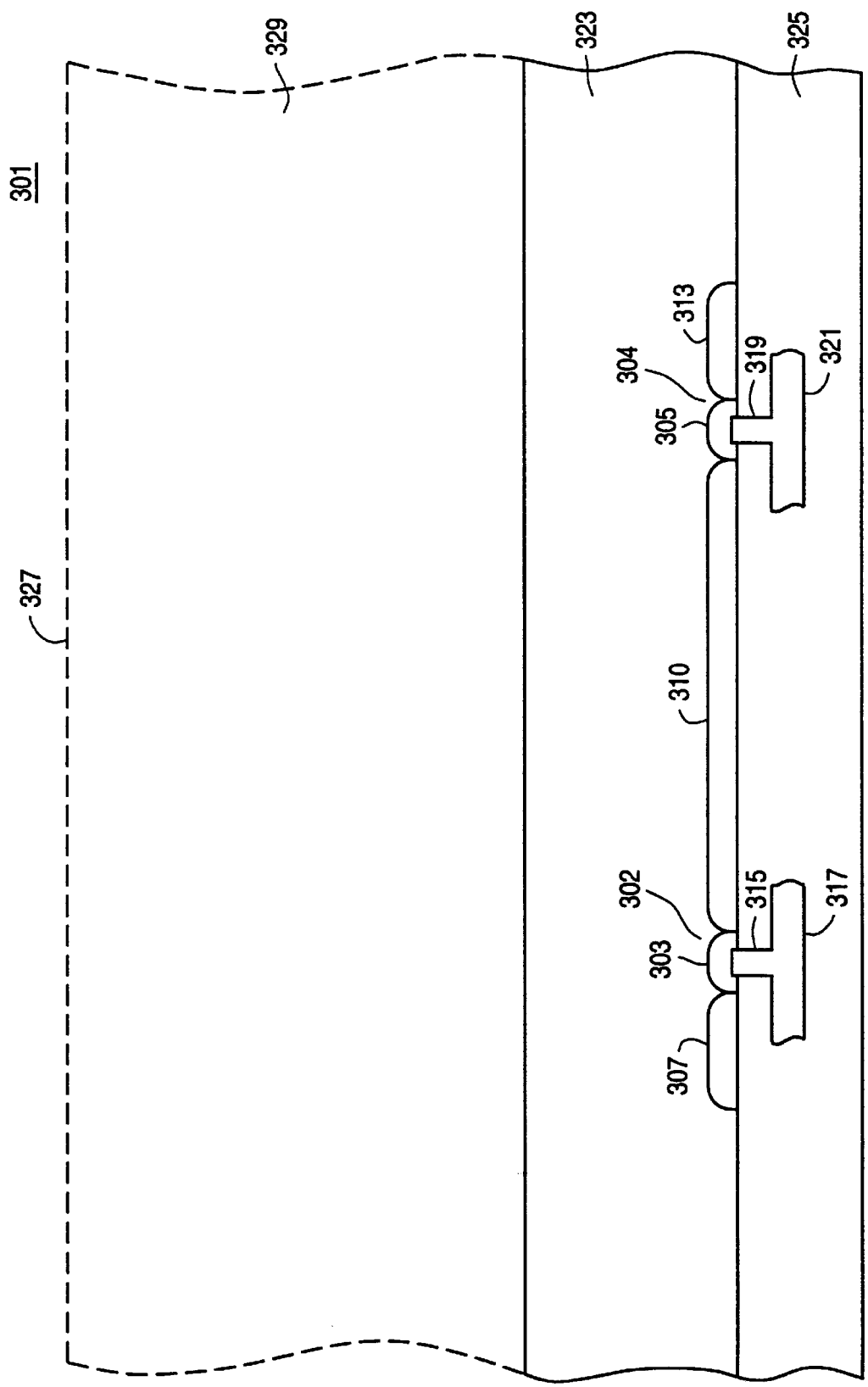
FIG. 3B is an illustration of a cross-section of a thinned flip-chip packaged integrated circuit die in accordance with the teachings of the present invention.

Assuming a circuit designer wishes to perform a circuit edit on integrated circuit die 301 by coupling together signal lines 317 and 321, connection targets 302 and 304 may be coupled together in accordance with the following steps. In one embodiment, flip-chip packaged integrated circuit die 301 is first thinned in the regions above connection targets 302 and 304. This aspect of the present invention is illustrated in FIG. 3B with back side portion 329 of semiconductor substrate 323 being removed above connection targets 302 and 304 from back side 327. In one embodiment, integrated circuit die 301 is globally thinned to a thickness of approximately 200 microns using well known polishing techniques. In another embodiment, integrated circuit die 301 may be locally trenched proximate to and between the regions above connection targets 302 and 304 to remove back side portion 329 using well known techniques.

Figure 3C:
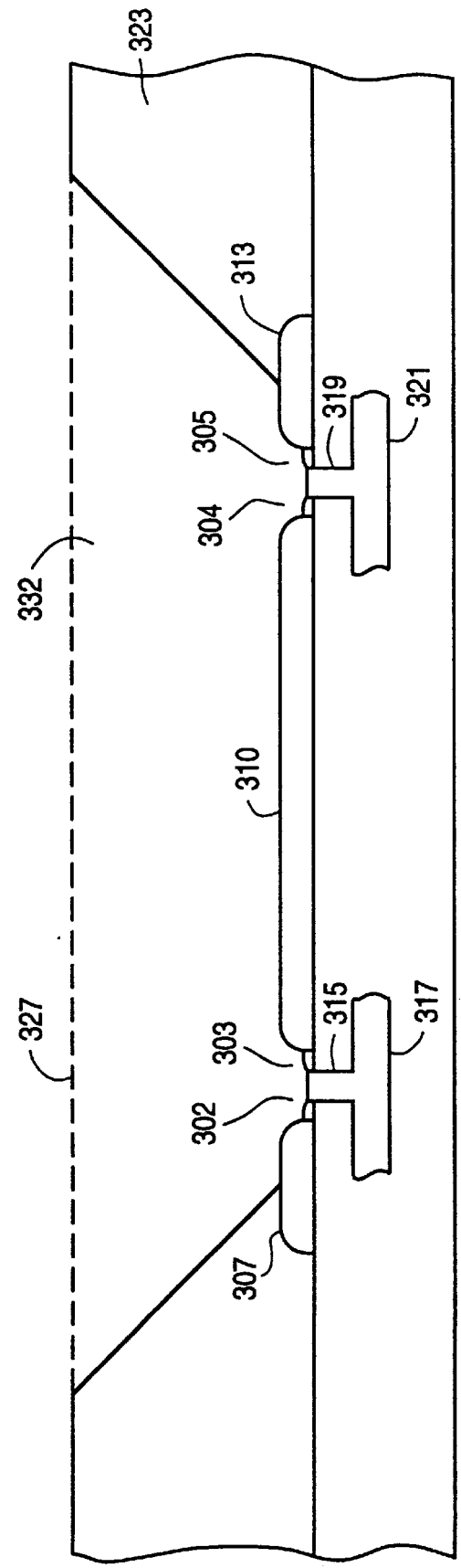
FIG. 3C is an illustration of a cross-section of a flip-chip packaged integrated circuit die with exposed circuit edit connection targets separated by a field oxide region in accordance with the teachings of the present invention.

After the thinning steps shown in FIG. 3B, a back side portion 332 of semiconductor substrate 323 above connection targets 302 and 304 and field oxide region 310 is milled away to expose connection targets 302 and 304 and field oxide region 310 from back side 327. In one embodiment, a portions of passive diffusions 303 and 305 are milled away and contacts 315 and 317 are directly exposed from back side 327. This aspect of the present invention is illustrated in FIG. 3C. In one embodiment, back side portion 332 is milled away using well known milling techniques, such as for example a FIB milling tool. After connection targets 302 and 304 and field oxide region 310 have been exposed as illustrated in FIG. 3C, the conductor 341 is deposited directly over connection target 302, field oxide region 310 and connection target 304 to couple together connection targets 302 and 304, thereby coupling together signal lines 317 and 321 in accordance with the teachings of the present invention.

Figure 3D:
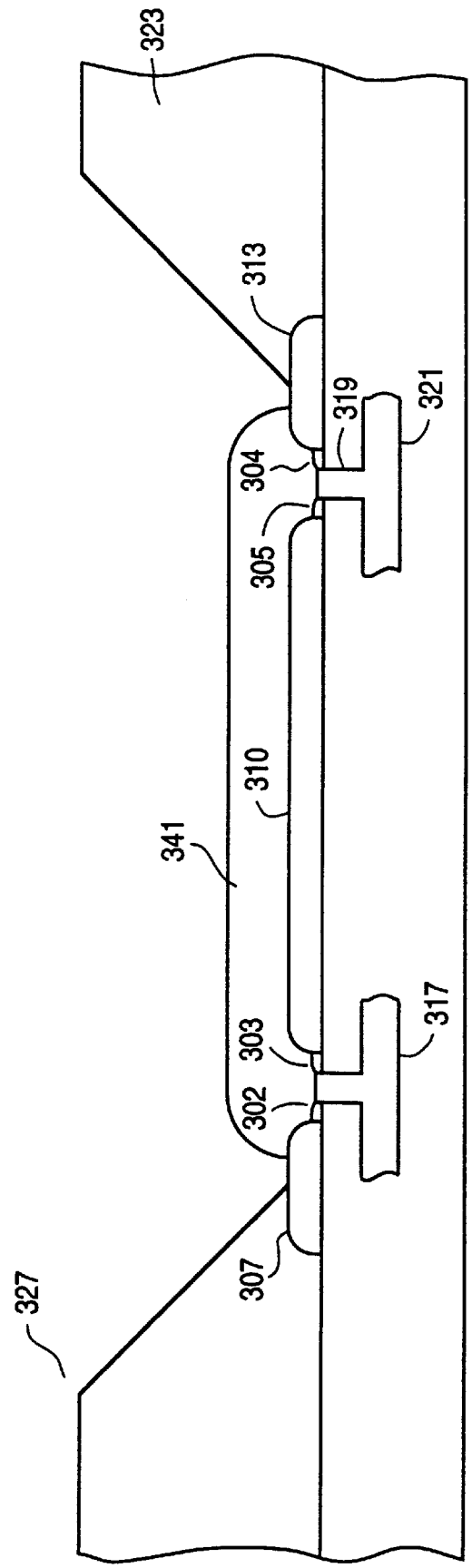
FIG. 3D is an illustration of a cross-section of a flip-chip packaged integrated circuit die with circuit edit connection targets connected together with a conductor deposited over the back side of the integrated circuit die in accordance with the teachings of the present invention.

It is appreciated that the step of depositing an insulating layer over the back side 327 of integrated circuit die 301, as illustrated in FIG. 2D is not performed in FIG. 3D because adequate electrical isolation is provided between semiconductor substrate 323 and 327 since field oxide region 310 extends the entire distance between connection targets 302 and 304. As a result, back side portion 332 of semiconductor substrate 323 was removed to expose both connection targets 302 and 304.

Figure 4A:
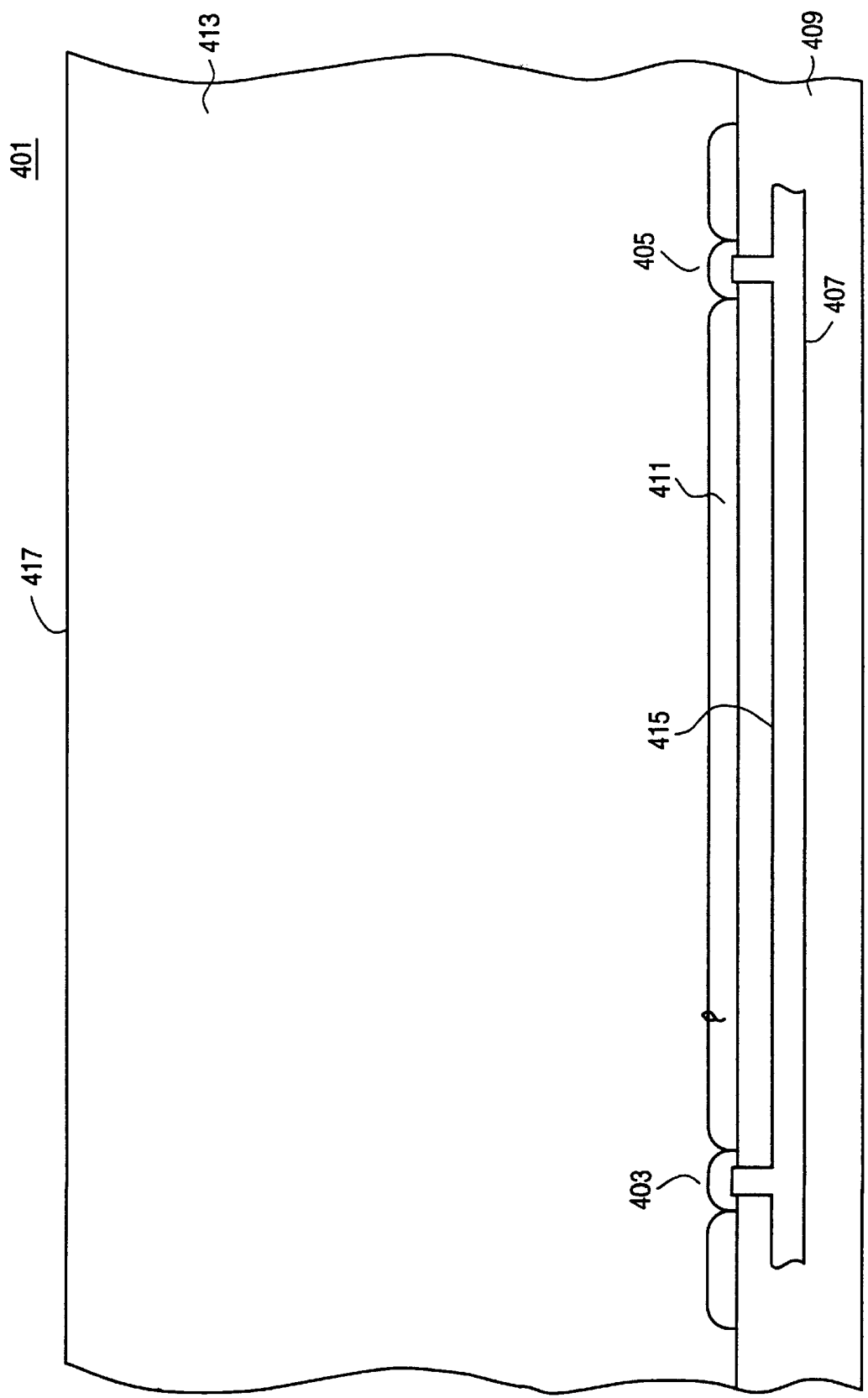
FIG. 4A is an illustration of a cross-section of a flip-chip packaged integrated circuit which includes a signal line to be cut in accordance with the teachings of the present invention.
Figure 4B:
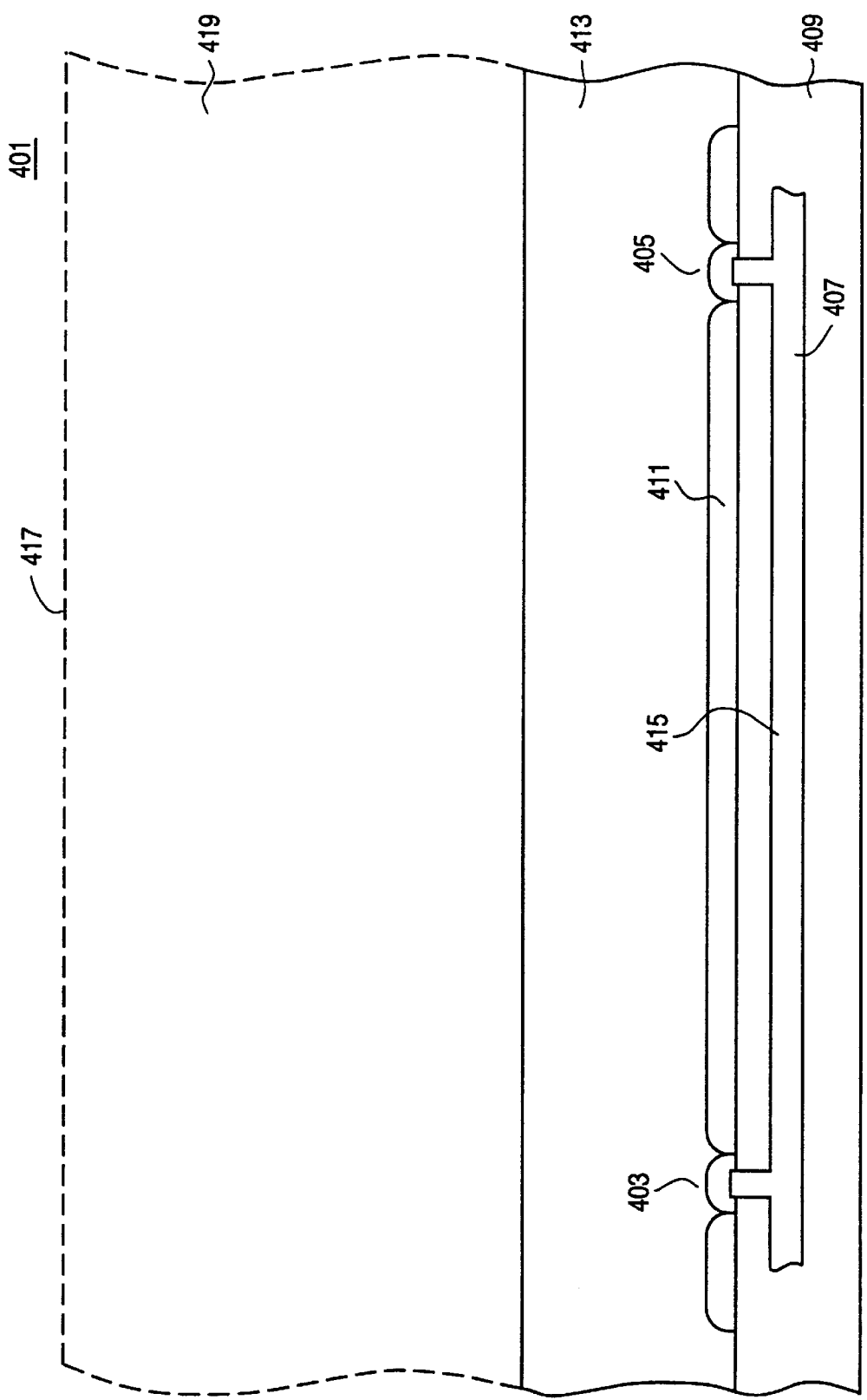
FIG. 4B is an illustration of a cross-section of a thinned flip-chip packaged integrated circuit die in accordance with the teachings of the present invention.

In another embodiment, a circuit designer may also wish to disconnect one node in an integrated circuit from another. FIG. 4A is an illustration of a cross-section of a flip-chip packaged integrated circuit die 401 having a node 403 coupled to node 405 through signal line 407. As shown in the embodiment illustrated in 4A, signal line 407 is disposed in a dielectric isolation layer 409 of integrated circuit die 401 beneath a field oxide region 411 below semiconductor substrate 413. In one embodiment, signal lines 407 is made of a conductive material, such as for example, metal, polysilicon, or the like. In one embodiment, node 403 may be disconnected from node 405 by cutting signal line 407 at circuit edit cut location 415 through back side 417 of integrated circuit die 401. Initially, flip-chip packaged integrated circuit die 401 is first thinned in the region above circuit edit cut location 415. This aspect of the present invention is illustrated in FIG. 4B with back side portion 419 of semiconductor substrate 413 being removed above circuit edit cut location 415 from back side 417 of integrated circuit die 401. In one embodiment, integrated circuit die 401 is globally thinned to a thickness of approximately 200 microns using well known polishing techniques. In another embodiment, integrated circuit die 401 may be locally trenched above circuit edit cut location 415 to remove back side portion 419 using well known techniques.

Figure 4C:
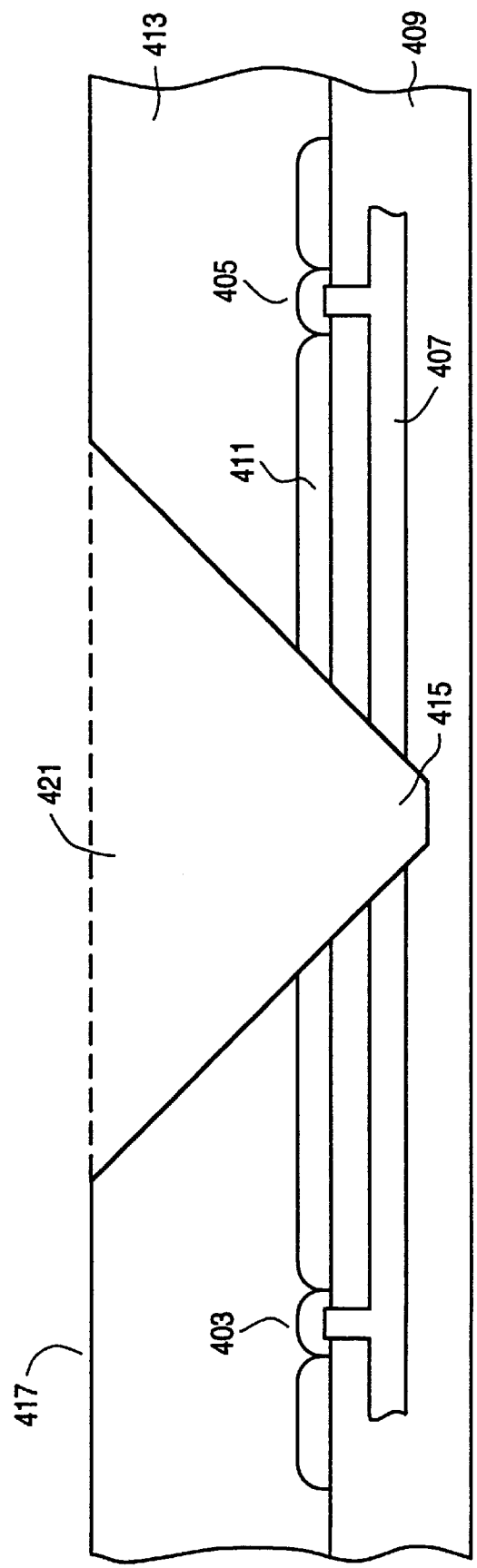
FIG. 4C is an illustration of a cross-section of a signal line that has been cut in a flip-chip packaged integrated circuit die in accordance with the teachings of the present invention.

After the thinning step in FIG. 4B, integrated circuit die 401 is milled to cut signal line 407 at circuit edit cut location 415. This aspect of the present invention is illustrated in FIG. 4C, which is a cross-section of integrated circuit die 401 showing circuit edit cut location 415 cut from back side 417 of integrated circuit die 401 through semiconductor substrate 413 and field oxide region 411. As shown in FIG. 4C, back side portion 421 of semiconductor substrate 413 has been removed from back side 417 of integrated circuit die 401 to cut signal line 407, thereby disconnecting node 403 from 405. It is noted that useful circuit edit structures and techniques for disconnecting integrated circuit nodes from one another are described in co-pending application Ser. No. 08/940,830, filed Sep. 30, 1997, entitled "Method and Apparatus Providing A Circuit Edit Through the Back Side of Integrated Circuit Die," and assigned to the Assignee of the present application.

Figure 5:
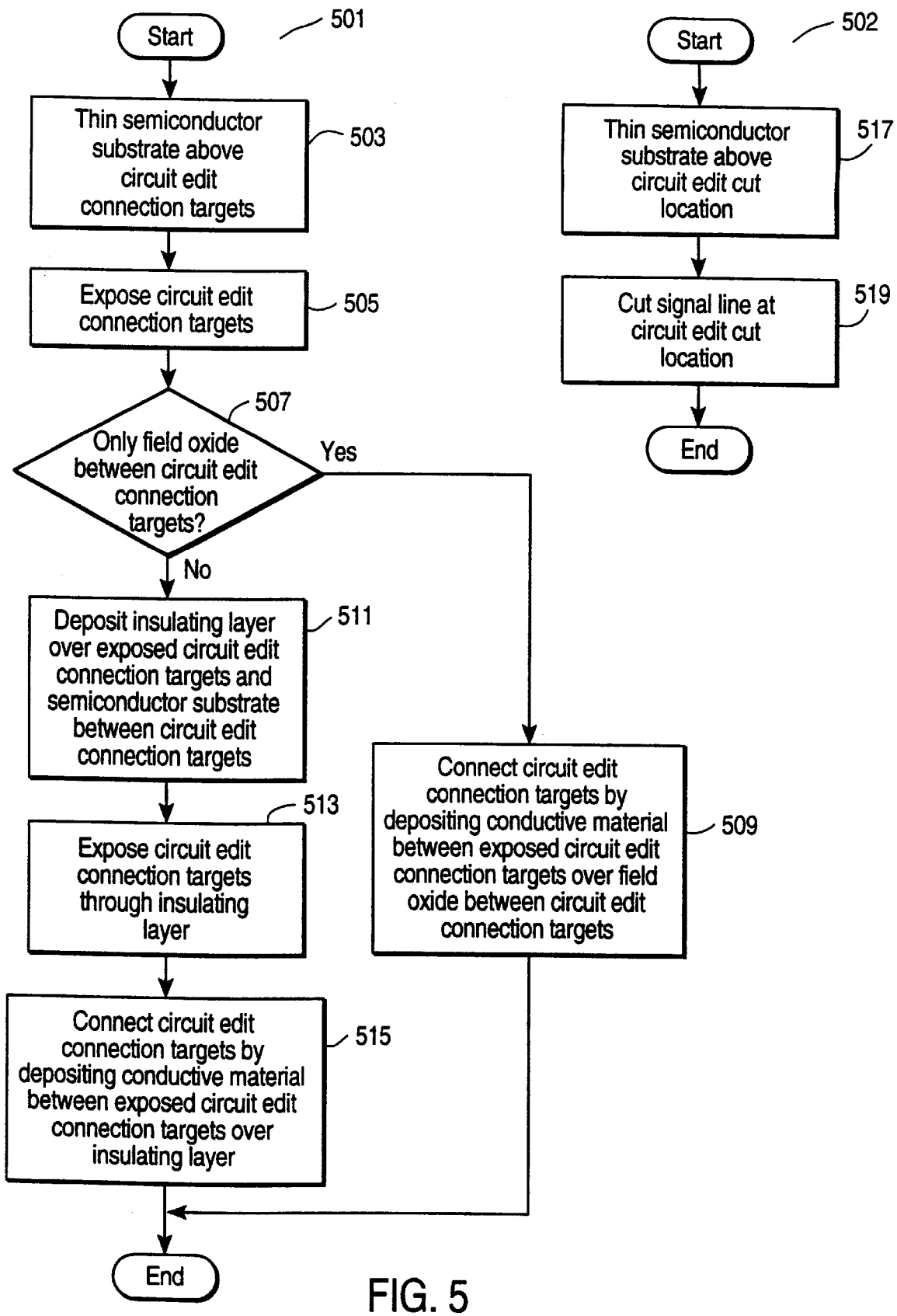
FIG. 5 is a flow chart diagram illustrating the circuit edit steps performed on a flip-chip packaged integrated circuit die in accordance with the teachings of the present invention.

Flow charts 501 and 502 of FIG. 5 show circuit edit steps performed through the back side of an integrated circuit die in accordance with the teachings of the present invention. When adding a circuit edit connection between two circuit edit connection targets in an integrated circuit, flow chart 501 shows that the semiconductor substrate is first thinned above the circuit edit connection targets as shown in processing block 503. Next, the circuit edit connection targets are exposed according to processing block 505. Next, it is determined whether only field oxide exists between the two circuit edit connection targets as shown in processing block 507. If so, the two circuit edit connection targets are connected by depositing conductive material between the exposed circuit edit connection targets over the field oxide between the circuit edit connection targets, as shown in processing block 509. If there is semiconductor substrate between the two circuit edit connection targets, then an insulating layer is deposited over the exposed circuit edit connection targets and the semiconductor substrate between the circuit edit connection targets as shown in processing block 511. Next, the circuit edit connection targets are exposed through the insulating layer as shown in processing block 513. Afterwards, the circuit edit connection targets are connected by depositing conductive material between the exposed circuit edit connection targets over the insulating layer as shown in processing block 515. In the event that a circuit designer wishes to cut a signal line, flow chart 502 shows that the semiconductor substrate above the circuit edit cut location is first thinned, as shown in processing block 517. Next, the signal line is exposed and cut at the circuit edit cut location, as shown in processing block 519.

Thus, what has been described is a method and an apparatus for performing circuit edits through the back side of a flip-chip packaged integrated circuit die. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and Figures are accordingly to be regarded as illustrative rather than restrictive.

What is claimed is:

1. In an integrated circuit die, a circuit edit, comprising:

first and second circuit edit connection targets accessed from a back side of the integrated circuit die through a semiconductor substrate of the integrated circuit die;

an insulating layer deposited over the semiconductor substrate of the integrated circuit die from the back side of the integrated circuit die between the first and second circuit edit connection targets from the back side of the integrated circuit die; and a conductor coupling the first and second circuit edit connection targets, the conductor deposited over the insulating layer between the first and second circuit edit connection targets from the back side of the integrated circuit die.

2. The circuit edit of claim 1 wherein the back side of the integrated circuit die comprises a trench, the trench including the first and second circuit edit connection targets, the trench including the insulating layer deposited over the semiconductor substrate of the integrated circuit die from the back side of the integrated circuit die between the first and second circuit edit connection targets, and the trench including the conductor coupling the first and second circuit edit connection targets.

3. The circuit edit of claim 1 further comprising a first node disconnected from a second node as a result of a cut from the back side of the integrated circuit die in a signal line disposed between the first and second nodes.

* * * * *